(12) United States Patent
Kerr

(10) Patent No.: US 6,843,875 B2
(45) Date of Patent: Jan. 18, 2005

(54) DENSITY CONTROL THROUGH LAMINATION

(75) Inventor: Roger S. Kerr, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 133 days.

(21) Appl. No.: 10/230,825

(22) Filed: Aug. 29, 2002

(65) Prior Publication Data
US 2004/0040647 A1 Mar. 4, 2004

(51) Int. Cl.[7] .............................. B44C 1/17; B32B 3/20; B41C 1/06; G03G 13/14; B41M 3/12
(52) U.S. Cl. ...................... 156/230; 156/240; 156/247; 156/272.2; 156/289; 427/148; 428/195.1; 428/914; 101/34; 430/126; 430/143
(58) Field of Search ................................. 156/230, 235, 156/239, 240, 241, 247, 277, 288, 272.2; 427/146, 147, 148; 428/40.1, 41.6, 41.8, 42.1, 42.3, 195.1, 200, 201, 202, 914; 101/34; 430/200, 201, 256, 262, 126, 143

(56) References Cited

U.S. PATENT DOCUMENTS 5,053,381 A * 10/1991 Chapman et al. ........... 503/227
5,300,398 A * 4/1994 Kaszczuk ................... 430/200

OTHER PUBLICATIONS

Creativepro.com, "Agfa Introduces SherpaMatic Duplex Proofing System", Sep. 6, 2003, available at http://www.creativepro.com/story/news/14387.html.*

* cited by examiner

Primary Examiner—J. A. Lorengo
(74) Attorney, Agent, or Firm—Buskop Law Group, P.C.

(57) ABSTRACT

The invention is a process for forming a press proof (190) by forming an imaged receiver sheet (140) comprising a first thermoplastic layer (240) and a first support layer (160) by disposing an image (290) with a first density on the first thermoplastic layer (240) by using a laser thermal transfer (220); forming a pre-laminate comprising a second thermoplastic layer (250) and a second support layer (170); laminating the pre-laminate (260) to a medium and removing the second support layer (170) forming a supported pre-laminate (270); laminating the imaged receiver sheet (140) to the supported pre-laminate (270) changing the density of the image to a second density using a temperature that exceeds the glass transition point of the thermoplastic layer (230) and a speed of between 10 and 40 inches per minute forming a supported color proof (310); and removing the first support forming a color proof (300).

15 Claims, 5 Drawing Sheets

DENSITY CONTROL THROUGH LAMINATION

FIELD OF THE INVENTION

The present invention relates to the art of color proofing, and in particular, to a method of controlling density by means of pressure and heat used to laminate media together.

BACKGROUND OF THE INVENTION

Pre-press proofing is a procedure that is used primarily by the printing industry for creating representative images of printed material. In the printing industry pre-press proofs are used to check for color balance, control parameters and other important image quality requirements, without the cost and time that is required to actually produce printing plates, set up a printing press and produce an example of a representative image, which would result in higher costs and a loss of profits that would ultimately be passed on to the customer.

To create a pre-press proof first an original image is separated into individual color separations or digital files. The original image is scanned and separate into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. Third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone imaging capabilities. The above-mentioned image processing apparatus is arranged to form a representative image onto a sheet of print media in which colorant from a sheet of colorant donor material is transferred to the print media, by applying a sufficient amount of thermal energy to the colorant donor sheet material to form the representative image. The image processing apparatus is comprised generally of a material supply assembly and a lathe bed scanning subsystem. The scanning subsystem includes: a lathe bed scanning frame, translation drive, translation stage member, print head, imaging drum, and media exit transports.

The operation of the image processing apparatus comprises of metering a length of the print media (in roll form) from the material supply assembly. The print media is then measured and cut into sheet form of the required length and transported to the imaging drum, registered, wrapped around, and secured onto the imaging drum. Next, a length of colorant door material (in roll form) is also metered out of the material supply assembly, then measured and cut into sheet form of the required length. It is then transported to the imaging drum. Wrapped around the imaging drum utilizing a load roller which is described in detail, in commonly assigned U.S. Pat. No. 5,268,708, such that it is superposed in the desired registration with respect to the print media (which has already been secured to the imaging drum).

After the colorant donor sheet material is secured to the periphery of the imaging drum the scanning subsystem or write engine provides the imaging function. This image function is accomplished by retaining the print media and the colorant donor sheet material on the imaging drum while it is rotated past the print head. The translation drive traverses the print head and translation stage member axially along the axis of the imaging drum, in coordinated motion with the rotating imaging drum. These movements combine to produce the representative image on the print media.

Once the representative image has been formed on the print media, the colorant donor sheet material is then removed from the imaging drum. This is accomplished without disturbing the print media that is beneath it. The colorant donor sheet material is then transported out of the image processing apparatus by means of the material exit transport. Additional colorant donor sheet materials featuring other desired colorants are sequentially superimposed with the print media on the imaging drum and then imaged onto the print media as previously mentioned, until the representative image is completed on the print media. The representative image formed thereon is then unloaded from the imaging drum and transported by the receiver sheet material exit transport to an exit tray in the exterior of the image processing apparatus.

After a representative image has been formed on the print media as previously described it is transferred to a receiver stock such that the pre-press proof is representative of the intended image to be printed on a printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and copending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a thermal print layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

Although the above described lamination method works well for most materials and both laser them and ink jet pre-press proofs, there exists a need for laminating a wider variety of pre-press proofs such as an embossed pre-press proof to have appear to have a hologram or foil effect used in the graphics packaging market.

SUMMARY OF THE INVENTION

The invention is a process for forming a press proof by forming an imaged receiver sheet with a thermoplastic and support layer by disposing an image with a density on the thermoplastic layer using a laser thermal transfer. A pre-laminate 260 with another thermoplastic and support layer is formed. The process continues by laminating the pre-laminate to a medium forming a supported pre-laminate, laminating the imaged receiver sheet to the supported pre-laminate changing the density of the image using a temperature that exceeds the glass transition point of the thermoplastic layer and a specific speed forming a supported color proof and eventually a color proof.

The invention is another process for forming a press proof by forming an imaged receiver sheet with a thermoplastic and support layer by disposing an image with a density on the thermoplastic layer using a laser thermal transfer, laminating the imaged receiver sheet to a medium and changing the density of the image by heating the imaged receiver sheet to a temperature that exceeds the glass transition point of the thermoplastic layer for a period of time and removing the support layer to form a press proof.

The invention is also another process for forming a press poof by forming a medium with a thermoplastic layer, forming an image on the thermoplastic layer using a laser thermal transfer on the medium forming an imaged medium, and changing the density of the image by heating the imaged medium to a temperature that exceeds the glass transition point of the thermoplastic layer for a period of time forming a press proof.

The invention is also a press proof with a resolution between about 1000 and about 4000 dpi formed by the processes to create a press proof. The invention is also a press proof with a resolution between about 1200 and about 3600 dpi formed by the processes to create a press proof.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proofs.

Figure 1:
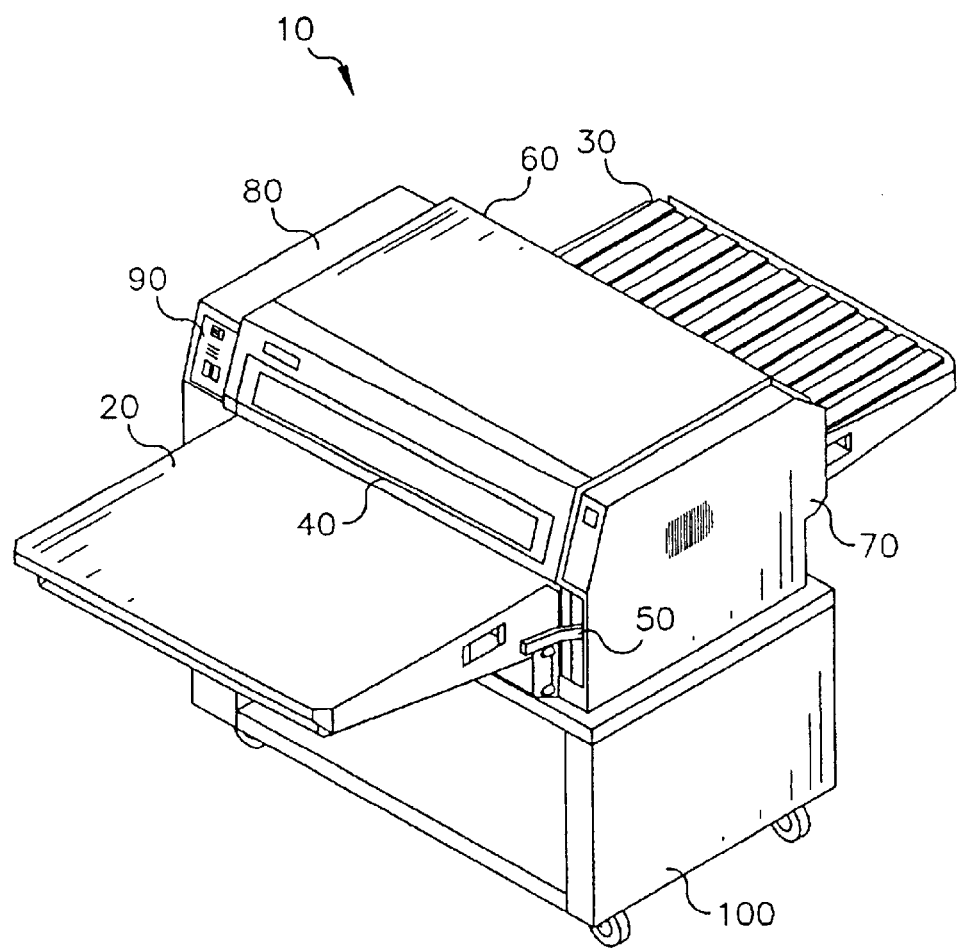
FIG. 1 is a perspective view showing a laminator known in the related are used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator 10 has an entrance table 20, exit table 30, entrance slot 40, pressure lever 50, top cover 60, right side cover 70, left side cover 80, control panel 90, and lamination base 100.

Figure 2:
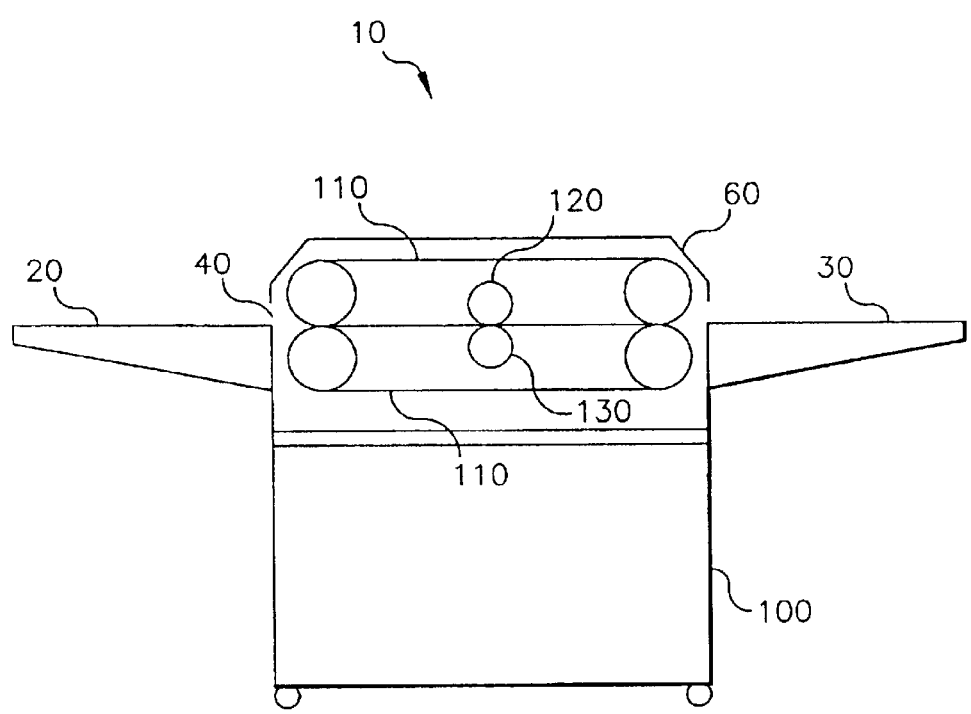
FIG. 2 is a schematic right side elevation of the laminator of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that only one of the upper lamination roller 120 and lower lamination roller 130 may be heated. It is further recognized that both upper lamination roller 120 and lower lamination roller 130 do not have to be heated for cold lamination applications.

The following methods are usable for forming a pre-press proof 200 with a resolution of between about 1000 and 4000 dpi, although in the most preferred embodiment, the high resolution is between 1200 and 3600 dpi. The image can be initially created on print media with an ink jet printer, laser printer, or any other printing method known in the art.

Figure 3:
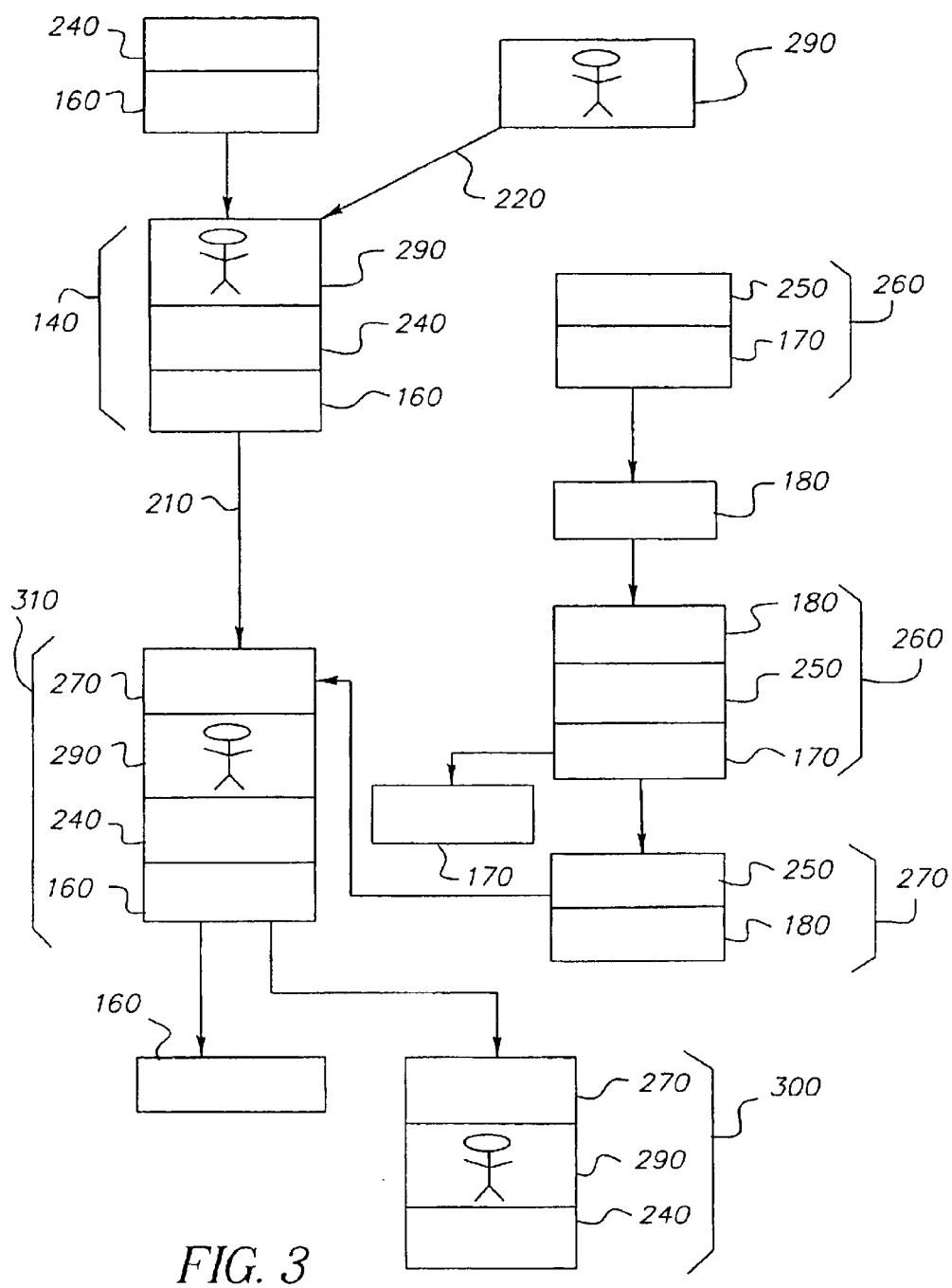
FIG. 3 is a block diagram showing one embodiment of the process for producing a press proof of the invention.

FIG. 3 is a block diagram outlining the invention process for forming a press proof 190. The process includes forming an imaged receiver sheet 140 with a first thermoplastic layer 240 and a first support layer 160 by disposing an image 290 with a first density on the first thermoplastic layer 240 by means of a laser thermal transfer 220. The process continues by forming a pre-laminate 260 comprising a second thermoplastic layer 250 and a second support layer 170, laminating the pre-laminate 260 to a medium 180 and removing the second support layer 170 forming a supported pre-laminate 270. The process ends by laminating the imaged receiver sheet 140 to the supported pre-laminate 270 changing the density of the image 290 to a second density by applying heat 210 to temperature that exceeds the glass transition point of the thermoplastic layer and a speed of between 10 and 40 inches per minute forming a supported color proof 310 and removing the first support layer 160 forming a color proof 300.

The medium in the process for forming a press proof 190 can be paper, plastic sheets, metal, ceramic, glass, graphic composite or combinations thereof. The temperature used in the process can be between about 115° F. and 150° F. with speed ranges from about 20 to 30 inches per minute wherein the temperature used decreases relative to the decrease in the rate of speed. The image used in the process can be a halftone color image. The thermoplastic layer in the process can be is a member of the group: polyvinyl alcohol-co-butyral, polyester, polycarbonate. The press proof formed in the process can be dual sided.

Figure 4:
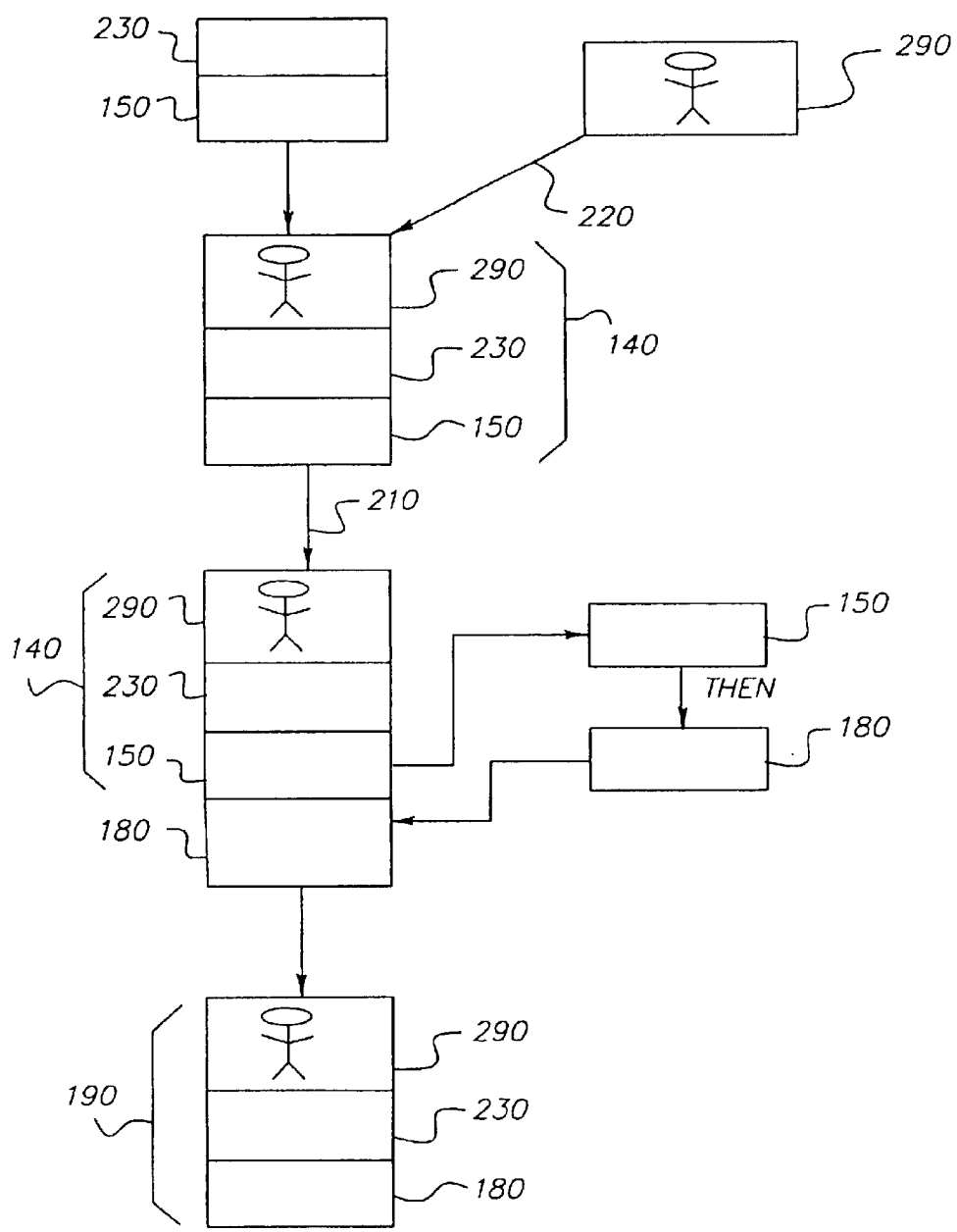
FIG. 4 is a block diagram showing another embodiment of the process for producing a press proof of the invention.

FIG. 4 is a block diagram outlining an alternative embodiment of the invention. In this embodiment, the invention relates to another process for forming a press proof 190. The process involves forming an imaged receiver sheet 140 comprising a thermoplastic layer 230 and a support layer 150 by disposing an image 290 with a first density on the thermoplastic layer 230 by means of a laser thermal transfer 220. The process continues by laminating the imaged receiver sheet 140 to a medium 180 and changing the first density of the image 290 to a second density by applying heat 210 to the imaged receiver sheet 140 to a temperature that exceeds the glass transition point of the thermoplastic layer 230 for a period of between 0.05 and 5 minutes, and, finally, removing the support layer 150 forming a press proof 190.

The medium in the process for forming a press proof 190 can be paper, plastic sheets, metal, ceramic, glass, graphic composite or combinations thereof. The temperature used in the process can be between about 115° and 150° F. and the period of exposure can be between about 0.1 and 1 minutes. The temperature decreases relative to the period of exposure to the temperature. The image in the process can be a halftone color image. The thermoplastic layer in the process can be polyvinyl alcohol-co-butyral, polyester, or polycarbonate. The press proof of the process can be dual sided.

Figure 5:
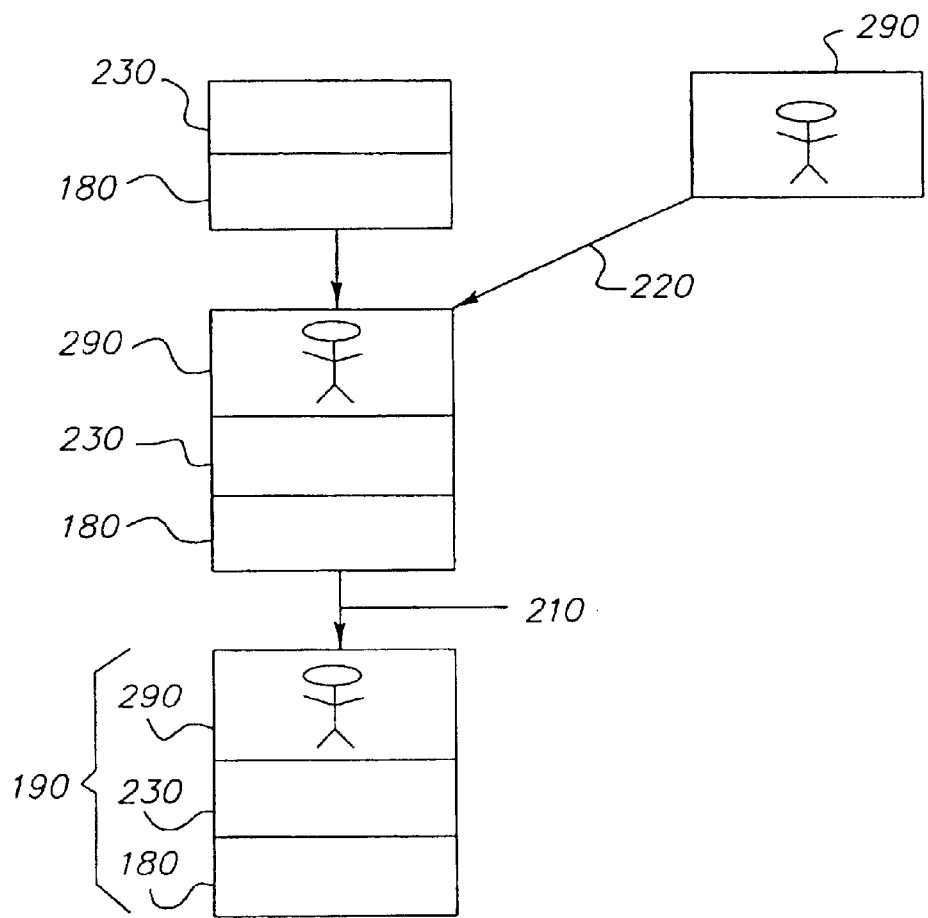
FIG. 5 is a block diagram showing another embodiment of the process for producing a press proof of the invention.

FIG. 5 is a block diagram outlining an alternative embodiment of the invention. In this embodiment, the invention relates to another process for forming a press poof 190. The process includes forming a medium 180 having a thermoplastic layer 230, forming an image 290 having a first density on the thermoplastic layer 230 by means of a laser thermal transfer 220 on the medium 180 forming an imaged medium 280, and changing the first density of the image 290 to a second density by applying heat 210 to the imaged medium 280 to a temperature that exceeds the glass transition point of the thermoplastic layer for a period of between 0.05 and 5 minutes forming a press proof 190.

The medium in the process for forming a press proof 190 can be paper, plastic sheets, metal, ceramic, glass, graphic composite or combinations thereof. The temperature used in the process can be between about 115° and 150° F. and the period of exposure is between about 0.1 and 1 minutes. The temperature decreases relative to the period of exposure to the temperature. The image in the process can be a halftone color image. The thermoplastic layer in the process can be polyvinyl alcohol-co-butyral, polyester, or polycarbonate. The press proof in the process can be dual sided.

The invention is also a press proof with a resolution between about 1000 and about 4000 dpi formed by the processes described in FIG. 3, FIG. 4, and FIG. 5. The images formed in this invention can be a multicolored image and/or a monochrome image.

The invention is also a press proof with a resolution between about 1200 and about 3600 dpi formed by the processes described in FIG. 3, FIG. 4, and FIG. 5. The images formed in this invention can also be a multicolored image and/or a monochrome image.

The invention has been described in detail with particular reference to certain preferred embodiments thereof, but it will be understood that variations and modifications can be effected within the scope of the invention.

Parts List

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Imaged receiver sheet
150. Support layer
160. First support layer
170. Second support layer
180. Medium
190. Press proof
210. Applied heat
220. Laser thermal transfer
230. Thermoplastic layer
240. First thermoplastic layer
250. Second thermoplastic layer
260. Pre-laminate
270. Supported pre-laminate
280. Imaged medium
290. Image
300. Color proof
310. Supported color proof

What is claimed is:

1. A process for forming a press proof consisting of:
    a. forming an imaged receiver sheet comprising a first thermoplastic layer and a first support layer by disposing an image with a first density on the first thermoplastic layer by means of a laser thermal transfer wherein the thermoplastic layer is a member of the group consisting of polyvinyl alcohol-co-butyral, polyester, and polycarbonate;
    b. forming a pre-laminate comprising a second thermoplastic layer and a second support layer;
    c. laminating the pre-laminate to a medium and removing the second support layer forming a supported pre-laminate;
    d. laminating the imaged receiver sheet to the supported pre-laminate changing the density of the image to a second density using a temperature that exceeds the glass transition point of the first thermoplastic layer between about 115° F. and 150° F. and passes through a lamination apparatus at a speed of between 10 and 40 inches per minute forming a supported color proof; and
    e. removing the first support forming a color proof with a resolution ranging between 1000 and 4000 dpi.

2. The process of claim 1 wherein the medium is a member of the group comprising: paper, plastic sheets, metal, ceramic, glass, graphic composite and combinations thereof.

3. The process of claim 1 wherein the speed ranges from about 20 to 30 inches per minute, and wherein the temperature used decreases relative to the decrease in the rate of speed.

4. The process of claim 1 wherein the image is a halftone color image.

5. The process of claim 1 wherein the press proof is dual sided.

6. A process for forming a press proof consisting of:
    a. forming an imaged receiver sheet comprising a thermoplastic layer and a support layer by disposing an image with a first density on the thermoplastic layer by means of a laser thermal transfer wherein the thermoplastic layer is a member of the group consisting of polyvinyl alcohol-co-butyral, polyester, and polycarbonate;
    b. laminating the imaged receiver sheet to a medium and changing the first density of the image to a second density by heating the imaged receiver sheet to a temperature that exceeds the glass transition point of the thermoplastic Layer between about 115° F. and 150° F. for a period of between 0.05 and 5 minutes; and
    c. removing the support layer forming a press proof with a resolution ranging between 1000 and 4000 dpi.

7. The process of claim 6 wherein the medium is a member of the group comprising: paper, plastic sheets, metal, ceramic, glass, graphic composite and combinations thereof.

8. The process of claim 6 wherein the period of exposure is between about 0.1 and 1 minutes and wherein the temperature decreases relative to the period of exposure to the temperature.

9. The process of claim 6 wherein the image is a halftone color image.

10. The process of claim 6 wherein the press proof is dual sided.

11. A process for forming a press poof consisting of:
 a. forming a medium having a thermoplastic layer wherein the thermoplastic layer is a member of the group consisting of polyvinyl alcohol-co-butyral, polyester, and polycarbonate;
 b. forming an image having a first density on the thermoplastic layer by means of a laser thermal transfer on the medium forming an imaged medium; and
 c. changing the first density of the image to a second density by heating the imaged medium to a temperature that exceeds the glass transition point of the thermoplastic layer between about 115° F. and 150° F. for a period between 0.05 and 5 minutes forming a press proof with a resolution ranging between 1000 and 4000 dpi.

12. The process of claim 11 wherein the medium is a member of the group comprising: paper, plastic sheets, metal, ceramic, glass, graphic composite and combinations thereof.

13. The process of claim 11 wherein the period of exposure is between about 0.1 and 1 minutes and wherein the temperature decreases relative to the period of exposure to the temperature.

14. The process of claim 11 wherein the image is a halftone color image.

15. The process of claim 11 wherein the press proof is dual sided.

* * * * *